United States Patent
Ahn et al.

(10) Patent No.: US 7,965,538 B2
(45) Date of Patent: Jun. 21, 2011

(54) ACTIVE PROTECTION DEVICE FOR RESISTIVE RANDOM ACCESS MEMORY (RRAM) FORMATION

(75) Inventors: Yongchul Ahn, Eagan, MN (US); Antoine Khoueir, Apple Valley, MN (US); Shuiyuan Huang, Apple Valley, MN (US); Peter Nicholas Manos, Eden Prairie, MN (US); Maroun Khoury, Burnsville, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 113 days.

(21) Appl. No.: 12/502,224

(22) Filed: Jul. 13, 2009

(65) Prior Publication Data

US 2011/0007552 A1    Jan. 13, 2011

(51) Int. Cl.
    *G11C 11/00*    (2006.01)
(52) U.S. Cl. .................. 365/148; 365/171; 365/226
(58) Field of Classification Search .......... 365/46, 365/113, 148, 158, 163, 17, 171
    See application file for complete search history.

(56) References Cited

U.S. PATENT DOCUMENTS

| | | | |
|---|---|---|---|
| 5,914,893 A | 6/1999 | Kozicki et al. | |
| 6,421,270 B1 | 7/2002 | Tai | |
| 6,831,331 B2 | 12/2004 | Kitamura et al. | |
| 6,909,628 B2 | 6/2005 | Lin et al. | |
| 7,605,079 B2 * | 10/2009 | Lai et al. | 438/666 |
| 7,789,350 B2 * | 9/2010 | Yu et al. | 248/56 |
| 2004/0179394 A1 * | 9/2004 | Ovshinsky et al. | 365/163 |
| 2005/0270821 A1 | 12/2005 | Nakano | |
| 2006/0221663 A1 * | 10/2006 | Roehr | 365/148 |
| 2010/0254182 A1 * | 10/2010 | Kuroiwa et al. | 365/158 |

* cited by examiner

*Primary Examiner* — Gene N. Auduong
(74) *Attorney, Agent, or Firm* — Fellers, Snider, et al.

(57) ABSTRACT

Apparatus and method for providing overcurrent protection to a resistive random access memory (RRAM) cell during an RRAM formation process used to prepare the cell for normal read and write operations. In accordance with various embodiments, the RRAM cell is connected between a first control line and a second control line, and an active protection device (APD) is connected between the second control line and an electrical ground terminal. A formation current is applied through the RRAM cell, and an activation voltage is concurrently applied to the APD to maintain a maximum magnitude of the formation current below a predetermined threshold level.

20 Claims, 3 Drawing Sheets

ACTIVE PROTECTION DEVICE FOR RESISTIVE RANDOM ACCESS MEMORY (RRAM) FORMATION

BACKGROUND

Solid state memories (SSMs) provide an efficient mechanism for storing and transferring data in a wide variety of applications, such as hand-held portable electronic devices. Individual memory cells within such memories can be volatile or non-volatile, and can store data by the application of suitable write currents to the cells to store a sequence of bits. The stored bits can be subsequently read during a read access operation by applying suitable read currents and sensing voltage drops across the cells.

Resistive random access memory (RRAM) is a type of SSM cell that provides different programmed resistances in relation to the presence or absence of migrated ions in an intervening barrier layer between opposing electrode layers. Some types of RRAM memory cells are designed to undergo an initial RRAM cell formation processing operation during manufacturing prior to normal use of the cells to store data.

An RRAM cell formation operation may involve the application of a relatively large formation voltage across the cell for an extended period of time in order to prepare the RRAM cell for normal read and write operations. In some instances it has been found that large current spikes induced as a result of the formation voltage can damage the cells, leading to reduced manufacturing yields and longer term reliability issues.

SUMMARY

Various embodiments of the present invention are generally directed to an apparatus and method for providing overcurrent protection to a resistive random access memory (RRAM) cell during an RRAM formation process used to prepare the cell for normal read and write operations.

In accordance with various embodiments, the RRAM cell is connected between a first control line and a second control line, and an active protection device (APD) is connected between the second control line and an electrical ground terminal. A formation current is applied through the RRAM cell, and an activation voltage is concurrently applied to the APD to maintain a maximum magnitude of the formation current below a predetermined threshold level.

These and other features and advantages which characterize the various embodiments of the present invention can be understood in view of the following detailed discussion and the accompanying drawings.

DETAILED DESCRIPTION

The present disclosure generally relates to the application of formation processing to resistive random access memory (RRAM) cells, and more particularly to a formation protection device (APD) that may be utilized in conjunction with one or more RRAM cells to protect against overcurrent conditions that may be induced during RRAM formation.

Figure 1A:
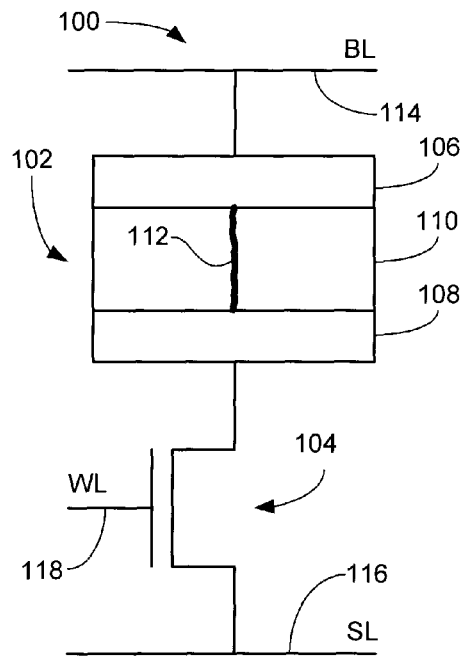
FIG. 1A is a schematic representation of a resistive random access memory (RRAM) cell.

FIG. 1A shows an exemplary RRAM cell 100 that can be used to store one or more bits in a solid state memory (SSM) array. It will be appreciated that other types and styles of RRAM cells can be readily utilized in accordance with various embodiments of the present invention, so that the particular constructions set forth in the drawings are merely illustrative and are not limiting to the claimed subject matter.

As shown in FIG. 1A, the RRAM cell 100 includes a resistive sense element (RSE) 102 coupled to a switching device 104. In some embodiments, the switching device 104 is characterized as an n-type metal oxide semiconductor field effect transistor (nMOSFET). The switching device 104 operates to allow selective access to the RRAM cell 100. This memory cell configuration is sometimes referred to as a 1T1R configuration (one transistor, one resistive element).

The RSE 102 includes opposing top and bottom conductive electrode layers 106, 108 separated by an intervening barrier layer 110. In some embodiments, the barrier layer has a relatively high electrical resistance, so that the RSE 102 is in a normally high resistive state ($R_H$).

Application of a suitable programming write voltage across the RRAM cell 100 will induce a flow of metal ions from one or both of the electrodes 106, 108, resulting in the formation of one or more conductive filaments 112 across the barrier layer 110 as shown. The presence of the filament(s) will place the RRAM cell in a second, lower resistive state ($R_L$).

The RSE 102 can be returned to the high resistive state by application of a second programming write voltage across the cell of opposite polarity, which will retract the metal ions from the barrier layer 112 and return the ions to the respective electrodes 106, 108. It will be appreciated that alternative RRAM configurations can be provided with a barrier layer of normally low resistance which is placed in a high resistive state by the migration of ions that form an intervening, low conductivity barrier region between the respective electrodes.

The RSE 102 and switching device (transistor) 104 are connected in series between first and second control lines respectively characterized as a bit line (BL) 114 and a source line (SL) 116. A third control line, characterized as a word line (WL) 118, is connected to a gate region of the switching device (transistor) 118. In this way, application of a suitable gate voltage to the WL 118 will place the cell 100 in a conductive state, and the appropriate write currents can be passed through the RSE 102 either from the BL 114 to the SL 116 or vice versa, depending on the desired state to which the cell is to be programmed.

During a read operation, the WL 118 is once again asserted and a smaller read current is passed through the cell, such as from BL 114 to SL 116. The resulting current will generate a voltage drop across the cell in relation to the programmed state of the RSE 102. This voltage drop can be compared to a suitable reference voltage using a sense amplifier (not separately shown) in order to determine the programmed state of the RSE.

Figure 1B:
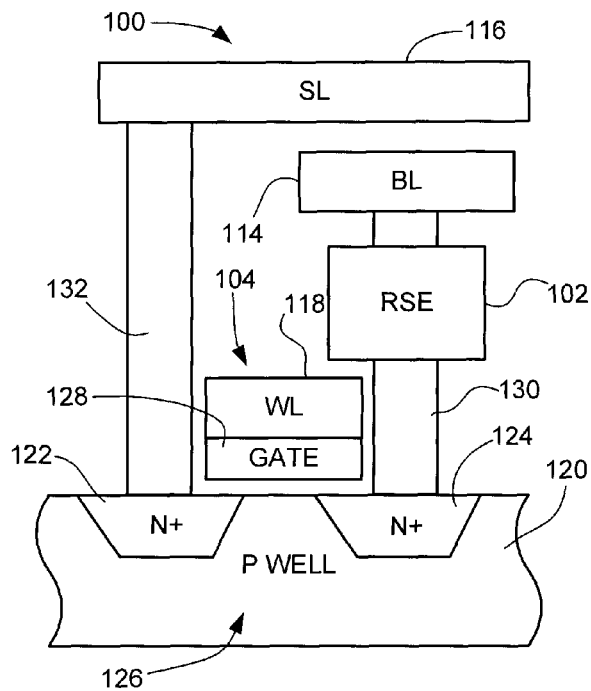
FIG. 1B is an elevational representation of an exemplary construction for the RRAM cell of FIG. 1A.

FIG. 1B provides an exemplary construction for the RRAM cell 100 of FIG. 1A. A base semiconductor substrate 120 is provided in which respective N+ doped source and drain regions 122, 124 are formed. The regions 122, 124 are separated by a P well region 126 and spanned by a polysilicon gate 128 to form the transistor 104.

A first conductive support structure 130 extends from drain region 124 to support and interconnect the RSE 102 with the BL 114. A second support structure 132 similarly extends from the source region 122 to support and interconnect the SL 116. Other configurations are readily envisioned, including but not limited to the use of a common source plane rather than individual source lines, the extension of the source lines underneath the cell structures, and the use of vertically stacked three-dimensional (3D) memory elements.

As will be appreciated by those skilled in the art, some types of RRAM cells such as 100 require the application of an RRAM formation process during manufacturing to prepare the cells for normal read and write operations. Such formation processing often involves the application of a formation voltage across the cells for an extended period of time to form various current paths and provide other conditioning to the various RSE layers.

The magnitude and duration of the formation voltage pulses are dependent on a number of factors, including the materials used in the RRAM cells, the dimensions (feature sizes, thicknesses, etc.) of the cells, and various circuit parameters such as the ON resistance of the cell transistors. Generally, the formation process can result in the application of relatively high current magnitudes through the cells. Under some circumstances, such high current magnitudes, including transient current spikes, can inadvertently induce damage to the cells.

Figure 2:
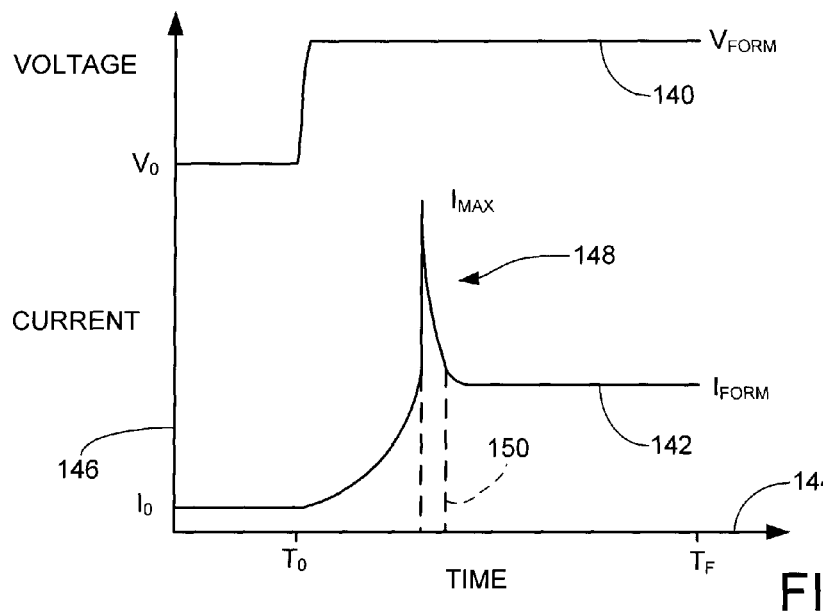
FIG. 2 shows respective RRAM voltage and current formation curves that may be experienced during an RRAM formation operation upon the RRAM cell of FIG. 1A-1B.

FIG. 2 sets forth respective voltage and current formation curves 140, 142 which exemplify typical voltage and current levels that may be experienced by an RRAM cell during a formation operation. The curves 140, 142 are plotted against an elapsed time x-axis 144 and a common magnitude y-axis 146.

As shown in FIG. 2, the formation process commences at time $T_0$ and ends at time $T_F$. During this interval, a steady state formation voltage $V_{FORM}$ is applied, such as across the BL 114 and SL 116 in FIG. 1A. It will be appreciated that other formation processes may subject the cell to varying levels of the formation voltage, and to multiple pulses of said voltage, as required.

Current curve 142 shows that the current through the cell ramps up from an initial value $I_0$ to a maximum level $I_{MAX}$ (spike 148) which exists for a spike interval 150 before being suppressed by associated internal circuits (not shown), after which the current magnitude levels out at the steady state magnitude $I_{FORM}$.

As will be appreciated, when an RRAM cell such as 100 in FIG. 1A-1B is being subjected to a formation process as set forth by FIG. 2, the cell may initially have a relatively high electrical resistance. This electrical resistance drops quickly as the conductive filament 112 is formed, resulting in a relatively fast transition to low resistance. If the total cell parasitic resistances are too small, the RRAM cell may provide the weakest link in the memory cell and could be opened like a fuse during the spike interval 150 due to Joule heating of the various electrical interconnections within the cell.

Figure 3A:
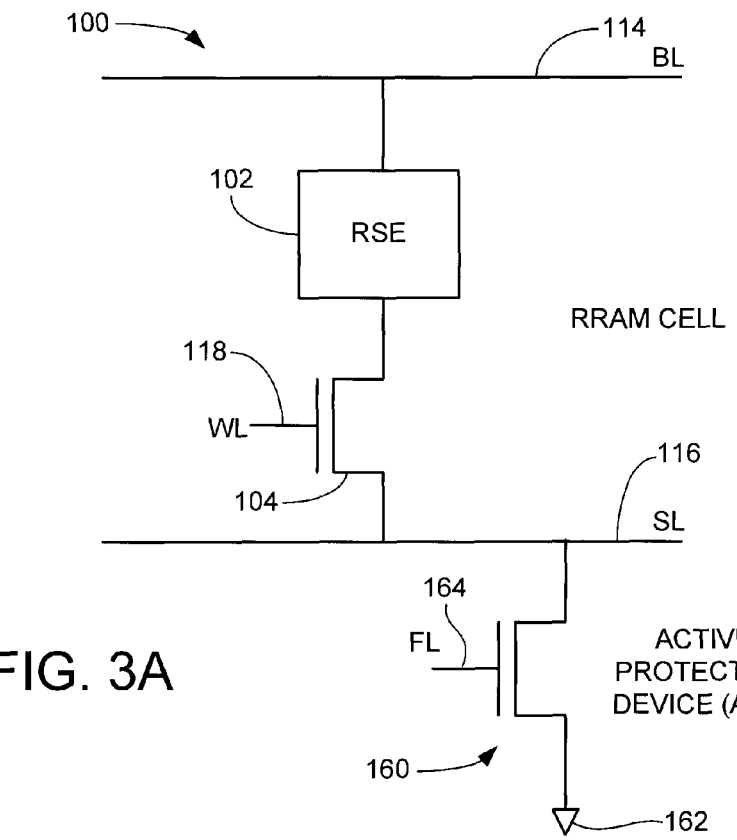
FIG. 3A is a schematic representation the RRAM cell of FIG. 1 in conjunction with an active protection device (APD) constructed and operated in accordance with various embodiments of the present invention.

Accordingly, various embodiments of the present invention provide overcurrent protection for RRAM cells such as 100 by the use of a active protection device (APD) 160 coupled to the RRAM cell, as set forth in FIG. 3A. In some embodiments, the APD 160 is a one-time-use device that is only utilized during a formation process, and is thereafter disabled during normal read and write operations. However, in other embodiments, the APD 160 is continually used during various data access operations.

Further in FIG. 3A, the APD 160 is connected between the SL 116 and an electrical ground terminal 162, and is activated by the application of a suitable activation voltage via formation line (FL) 164. As further shown in FIG. 3B, in some embodiments the APD 160 takes a general form of an n-type MOSFET with the use of an N well 168 (rather than an N+ doped region) for the device drain. This provides sufficient drain-source resistance to clamp the formation current and maintain the maximum current magnitude of the formation current below a predetermined threshold level. Said threshold level is selected to be sufficiently high to adequately prepare the RRAM cell for normal read and write operations while not being so high as to risk inducing damage to the cell.

Figure 3B:
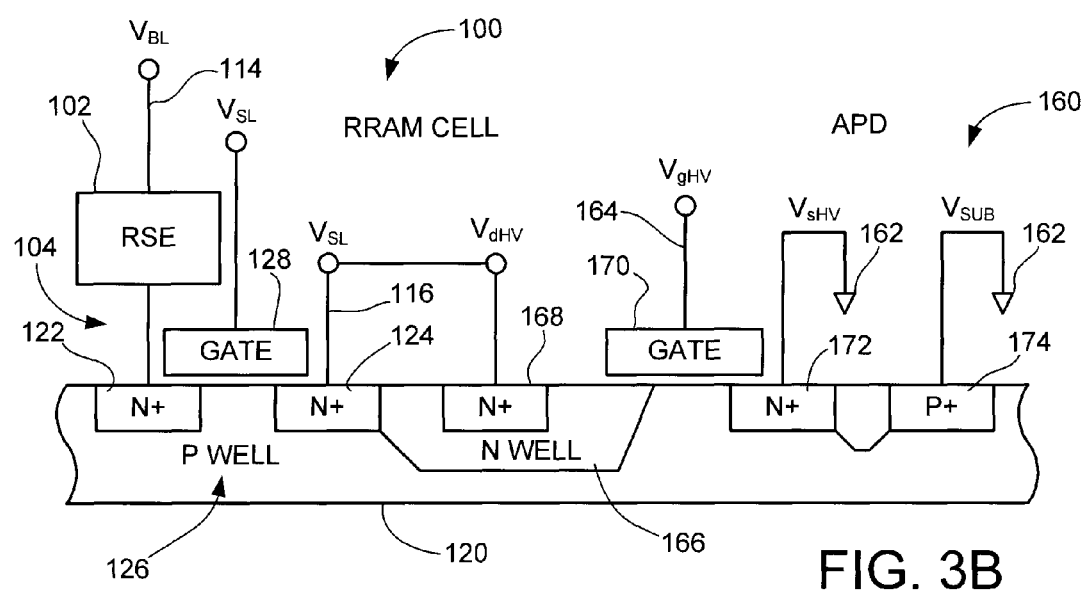
FIG. 3B illustrates an exemplary construction for the elements set forth in FIG. 3A.

In accordance with the exemplary construction of FIG. 3B, a permanent interconnection is provided between the SL 116 and an N+region 168 surrounded by the N well 166. A polysilicon gate 170 for the APD 160 spans the N well 166 and an N+ doped source region 172 connected to ground 162. A P+ doped region 174 is also connected to substrate ground 162.

During a formation operation, the APD 160 is affirmative activated by application of a suitable activation voltage to the gate 170. In some embodiments this voltage will have a magnitude $V_{gHV}$ as follows:

$$V_{gHV} = V_{FORM} + V_{TED} + 2V_{TN} \quad (1)$$

where $V_{FORM}$ is the required formation voltage across the RRAM cell 100 (see FIG. 2), $V_{TED}$ is the threshold voltage of the APD 160, and $V_{TN}$ is the threshold voltage of the cell transistor 104. The applied voltage $V_{gHV}$ in equation (1) accounts for the voltage drops through the two series transistors (104 and 160), as well as for the fact that the source voltage for the cell transistor 104 will be biased at a level above electrical ground (which may nominally double its threshold voltage in the bias range of interest).

As noted above, in at least some embodiments the APD 160 is only used during formation processing. This is because the presence of the APD 160 in the circuit during normal cell operation may interfere with normal programming and read operations upon the RRAM cell due to parasitic resistances of the APD. To isolate the APD 160 from further impacts upon the circuit, the FL line 164 is simply connected to electrical ground.

Figure 4:
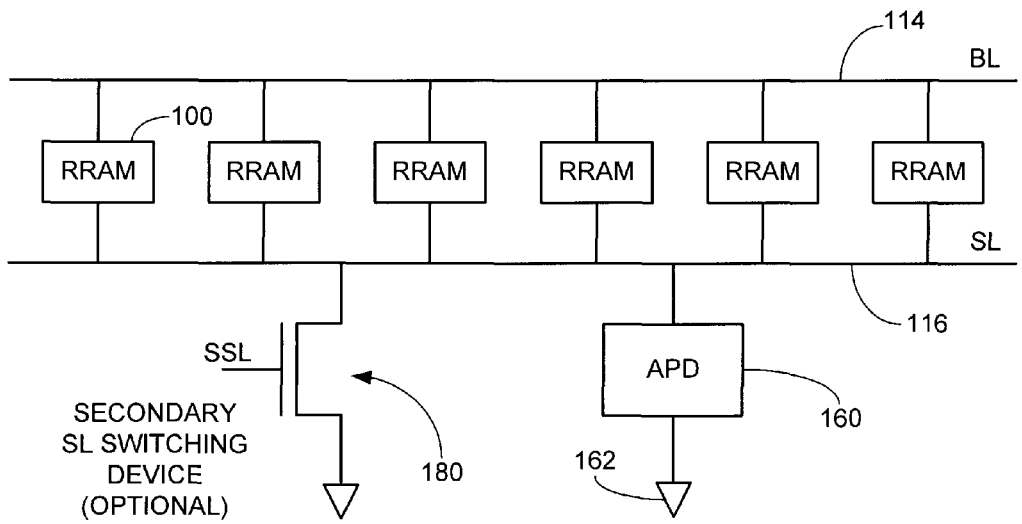
FIG. 4 shows the use of the APD of FIG. 3A-3B in conjunction with a plurality of adjacent RRAM cells in a data storage array.

A single APD 160 may be utilized for a plurality of RRAM cells 100, such as depicted in FIG. 4. In this case, the APD 160 may be left in an activated state while the various RRAM cells are subjected to formation processing, either individually or in parallel.

As desired, an optional secondary SL switching device 180 can be provided in parallel with the APD 160. This second switching device 180 can also be characterized as an n-type MOSFET and can be operated as a switch in the event that the SL 116 needs to be tied directly to electrical ground 162, such as during unipolar RRAM writing operations. Both the APD 160 and the secondary transistor 180 can be low voltage (LV) or thick gate high voltage (HV) FETs, depending on the expected voltages between the gates and the SL.

Figure 5:
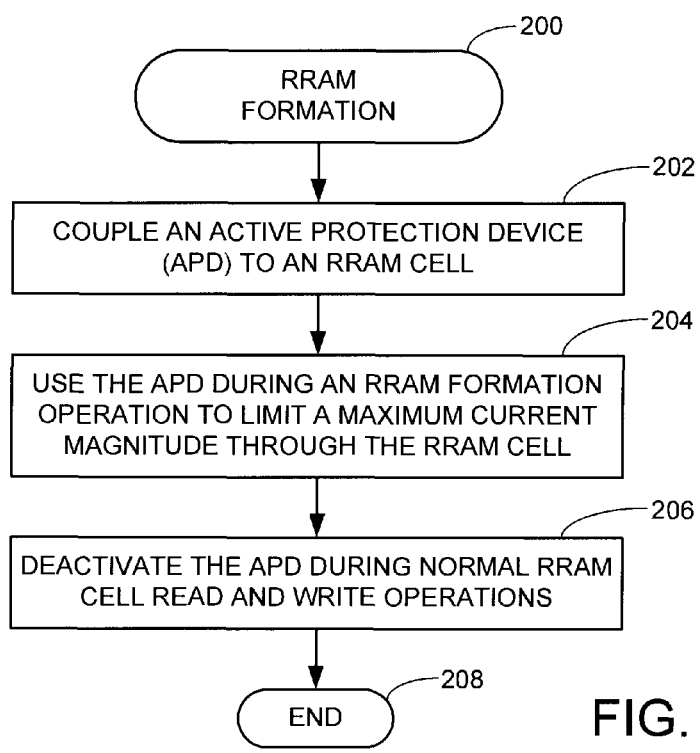
FIG. 5 is a flow chart for a RRAM FORMATION routine generally illustrative of steps carried out in accordance with various embodiments.

FIG. 5 provides a flow chart for an RRAM FORMATION routine 200 illustrative of various steps carried out in accordance with various embodiments. An APD such as 160 in FIG. 3A-3B and FIG. 4 is coupled to one or more RRAM cells such as 100 at step 202. The APD 160 is activated at step 204 during RRAM formation processing to clamp the maximum current flowing through the RRAM cell(s). As set forth above, this can be carried out by providing a suitable gate voltage to the APD 160 using suitable driver circuitry (not shown). The APD 160 is thereafter deactivated at step 206 during normal RRAM read and write operations, such as by tying the gate of the APD to ground. As will be appreciated by anyone with skill, normal read and write operations refer to use of the RRAM cell to store and retrieve data in accordance with normal operation of said cells, such as but not limited to field use by an end user. The process then terminates at 208.

During the normal read and write operations contemplated during step 206, further considerations may be required due to the interconnections established by the presence of the APD. During read operations, the APD will be deactivated by actively connecting the gate of the APD to electrical ground, and normal BL, SL and WL voltages ($V_{BL}$, $V_{SL}$ and $V_{WL}$) can be applied to the respective lines bit, source and word lines 114, 116 and 118 (see e.g., FIG. 3B).

During unipolar writing operations in which current is applied in a common direction through the cells, as shown by FIG. 4, the source line SL 116 can be connected to ground and appropriate voltages supplied to the bit and word lines 114, 118. This SL connection can be made directly or through the second transistor 180.

However, when bipolar memory cells are utilized, bipolar writing operations that apply current in opposite directions through the memory cells to obtain different programmed states can effect one write current direction more than the other write current direction. In a non-effected write current direction, application of a suitable voltage such as $V_{WRITE}$ to the bit and word lines 114, 118, and connecting the source line 116 to ground can program a predetermined resistive state to the memory cell. In contrast, writing in the other current direction can apply a higher voltage $V_{WRITE}+2V_{TN}$ to the source line 116 and the word line 118, and the bit line 114 can be connected to ground. Such higher write voltage in this second direction can accounts for the fact that there will be a voltage drop across the cell transistor.

It will now be appreciated that the various embodiments presented herein provide important advantages over the prior art. The use of an active protection device (APD) such as 160 during RRAM formation processing advantageously limits the maximum current magnitude that may flow through an RRAM cell, thereby reducing the potential for damage to the cell. Moreover, the APD can be easily isolated from an RRAM cell array so as to not affect normal read and write operations of the cells. The APDs as disclosed herein can be easily incorporated into existing RRAM manufacturing processes.

For purposes of the appended claims, the term active protection device (APD) and the like will be understood consistent with the foregoing device as an active device that is selectively activated by a control signal, as opposed to a passive device such as a diode or other steady-state circuit element.

It is to be understood that even though numerous characteristics and advantages of various embodiments of the present invention have been set forth in the foregoing description, together with details of the structure and function of various embodiments of the invention, this detailed description is illustrative only, and changes may be made in detail, especially in matters of structure and arrangements of parts within the principles of the present invention to the full extent indicated by the broad general meaning of the terms in which the appended claims are expressed.

What is claimed is:

1. An apparatus comprising:
    a resistive random access memory (RRAM) cell comprising a programmable resistive sense element (RSE) and a switching device connected in series between a first control line and a second control line; and
    an active protection device (APD) connected between the second control line and an electrical ground terminal which, when activated, limits a maximum formation current magnitude applied to the RSE during an RRAM formation process to prepare the RRAM cell for normal read and write operations, wherein the APD is subsequently placed in a deactivated, non-conductive state during the normal read and write operations upon the RRAM cell.

2. The apparatus of claim 1, wherein the RSE is connected to the first control line and the switching device is connected to the second control line.

3. The apparatus of claim 1, wherein the RSE comprises opposing electrode layers separated by an intervening barrier layer, wherein the RSE has a nominal first resistive state, and wherein migration of metal ions into the barrier layer during a programming operation transitions the RSE to a different, second resistive state.

4. The apparatus of claim 1, wherein the switching device is characterized as a metal oxide semiconductor field effect transistor (MOSFET), and wherein a third control line is connected to a gate region of the MOSFET to place the MOSFET in a drain-source conductive state.

5. The apparatus of claim 1, wherein the RRAM formation process flows current through the RSE from the first control line to the second control line to prepare the RRAM cell for normal read and write operations.

6. The apparatus of claim 1, wherein the APD is characterized as a metal oxide semiconductor field effect transistor with a polysilicon gate region that spans an N+ doped source region and an N well drain region to provide electrical resistance responsive to application of a gate voltage to said gate to limit said current to said maximum magnitude.

7. The apparatus of claim 1, further comprising a plurality of RRAM cells connected between the first and second control lines, wherein the APD limits a maximum current magnitude applied to each of said plurality of RRAM cells during an RRAM formation process applied to said cells to prepare said cells for normal read and write operations.

8. The apparatus of claim 1, further comprising a third control line connected to the APD, wherein a first voltage is applied to the first control line during said RRAM formation process, and wherein a second voltage is concurrently applied to the third control line during said RRAM formation process greater than the first voltage.

9. The apparatus of claim 1, further comprising a secondary switching device connected in parallel with the APD between the second control line and the ground terminal, the secondary switching device actively connecting the second control line to said ground terminal.

10. A method comprising:
    connecting a resistive random access memory (RRAM) cell comprising a programmable resistive sense element (RSE) in series with a switching device between a first control line and a second control line, and an active protection device (APD) between the second control line and an electrical ground terminal;
    applying a formation current through the RSE, the switching device and the APD during an RRAM formation process to prepare the RRAM cell for normal read and write operations, and concurrently applying an activation voltage to the APD to maintain a maximum magnitude of said formation current below a predetermined threshold level; and subsequently programming the RSE to a selected programmed state by applying a write current through the RSE and the switching device, the write current bypassing the APD.

11. The method of claim 10, wherein the applying step comprises applying a formation voltage to the first control line to flow said formation current through the RRAM cell from the first control line to the second control line, wherein the activation voltage is greater in magnitude than the formation voltage.

12. The method of claim 10, wherein the APD of the connecting step is characterized as a metal oxide semiconductor field effect transistor with a polysilicon gate region that spans an N+ doped source region and an N well drain region, and wherein the activation voltage concurrently applied to the APD is applied to said gate region to provide electrical resistance in series with the RRAM cell.

13. The method of claim 10, wherein the connecting step further comprises connecting a plurality of RRAM cells between the first and second control lines each comprising an associated RSE and an associated switching device, and wherein the applying step comprises applying said formation current through each of the associated RSEs of said plurality of RRAM cells while concurrently activating the APD to limit the magnitude of the formation current below said threshold level.

14. The method of claim 10, wherein the connecting step further comprises connecting a secondary switching device connected in parallel with the APD between the second control line and the ground terminal, and wherein the method further comprises subsequently actively connecting the second control line to said ground terminal.

15. The method of claim 10, wherein the RSE comprises opposing electrode layers separated by an intervening barrier layer, wherein the RSE has a nominal first resistive state, and wherein migration of metal ions into the barrier layer during a programming operation transitions the RSE to a different, second resistive state.

16. An apparatus comprising:

a plurality of resistive random access memory (RRAM) cells connected between a common bit line and a common source line, each RRAM cell comprising a programmable resistive sense element (RSE) in series with a switching device; and an active protection device (APD) connected between the common source line and a reference terminal, the APD limiting a maximum formation current magnitude applied to the respective RSEs of said plurality of RRAM cells during an RRAM formation process to prepare said plurality of RRAM cells for normal read and write operations.

17. The apparatus of claim 16, further comprising a secondary switching device connected in parallel with the APD between the common source line and the reference terminal, the secondary switching device deactivated during the RRAM formation process and activated during said normal read and write operations.

18. The apparatus of claim 16, in which the common bit line and the common source line extend adjacent said plurality of RRAM cells in a common direction.

19. The apparatus of claim 16, further comprising a plurality of word lines that extend adjacent the plurality of RRAM cells, each word line in said plurality connected to a gate region of a different selected switching device of the plurality of RRAM cells.

20. The apparatus of claim 16, in which the APD is characterized as a metal oxide field effect transistor (MOSFET) formed in a substrate of a semiconductor on which the plurality of RRAM cells is formed.

* * * * *